(12) United States Patent
Naseef

(10) Patent No.: US 12,248,008 B2
(45) Date of Patent: Mar. 11, 2025

(54) METHOD, SIGNAL PROCESSING DEVICE, AND MEASUREMENT APPLICATION DEVICE

(71) Applicant: ROHDE & SCHWARZ GMBH & CO. KG, Munich (DE)

(72) Inventor: Mahmud Naseef, Planegg (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 253 days.

(21) Appl. No.: 17/934,419

(22) Filed: Sep. 22, 2022

(65) Prior Publication Data

US 2024/0103056 A1     Mar. 28, 2024

(51) Int. Cl.
*G01R 23/16*     (2006.01)
*G01R 13/02*     (2006.01)

(52) U.S. Cl.
CPC ............ *G01R 23/16* (2013.01); *G01R 13/02* (2013.01)

(58) Field of Classification Search
CPC ....... G01R 23/16; G01R 13/02; G01R 13/029
USPC .................. 324/76.19, 76.12, 76.11
See application file for complete search history.

(56) References Cited

U.S. PATENT DOCUMENTS

| | | | | |
|---|---|---|---|---|
| 10,119,996 B2 * | 11/2018 | Pawar | .................. | G01R 13/029 |
| 12,025,638 B1 * | 7/2024 | Gines | .................... | G01R 29/26 |
| 2019/0162764 A1 * | 5/2019 | Barsumian | ......... | G01R 31/3025 |
| 2021/0184795 A1 | 6/2021 | Casas et al. | | |
| 2021/0226649 A1 | 7/2021 | Ortyl, III et al. | | |
| 2021/0390004 A1 | 12/2021 | Kundu et al. | | |
| 2022/0043031 A1 * | 2/2022 | Freidhof | ................ | G01R 13/24 |
| 2023/0221352 A1 * | 7/2023 | Waldo | ................. | G06F 3/04845 |
| | | | | 702/68 |
| 2023/0297223 A1 * | 9/2023 | Ferrante | ............... | G01R 13/029 |
| | | | | 702/104 |

FOREIGN PATENT DOCUMENTS

| | | |
|---|---|---|
| JP | S6229285 A | 2/1987 |
| WO | 2021080784 A1 | 4/2021 |

OTHER PUBLICATIONS

Tektronix Inc. RF Recording and Playback Solutions Brochure, 2022.
Anritsu Corporation MS269xA Signal Analyzer Product Brochure.

* cited by examiner

*Primary Examiner* — Giovanni Astacio-Oquendo
(74) *Attorney, Agent, or Firm* — BROOKS KUSHMAN P.C.

(57) ABSTRACT

The present disclosure provides a method for processing acquired RF spectrum data that represents an RF signal, the method comprising acquiring at least one graphical representation of the RF spectrum data, and extracting at least one signal property of the RF signal from the graphical representation. Further, the present disclosure provides a respective signal processing device, and a respective measurement application device.

23 Claims, 5 Drawing Sheets acquiring at least one graphical representation of the RF spectrum data — S1 extracting at least one signal property of the RF signal from the graphical representation — S2

METHOD, SIGNAL PROCESSING DEVICE, AND MEASUREMENT APPLICATION DEVICE

TECHNICAL FIELD

The disclosure relates to a method for processing acquired radio frequency (RF) spectrum data that represents an RF signal, a respective signal processing device, and a respective measurement application device.

BACKGROUND

Although applicable to any type of measurement application device, the present disclosure will mainly be described in conjunction with data acquisition in measurement applications.

In RF measurement applications acquired RF spectrum data may be stored as IQ data recording for later analysis or signal reproduction. The data files with IQ data that result from the acquired RF spectrum data may require huge amounts of data memory or storage space. The size of the data files especially depends on the bandwidth of the acquired signal. With limited storage space, the amount of IQ data that may be stored is also limited.

Accordingly, there is a need for providing a more efficient storage for acquired RF spectrum data.

SUMMARY

The above stated problem is solved by the features of the independent claims. It is understood, that independent claims of a claim category may be formed in analogy to the dependent claims of another claim category.

Accordingly, it is provided: A method for processing acquired RF spectrum data that represents an RF signal, the method comprising acquiring at least one graphical representation of the RF spectrum data, and extracting at least one signal property of the RF signal from the graphical representation.

Further, it is provided: A signal processing device for processing acquired RF spectrum data that represents an RF signal, the signal processing device comprising a processor configured to execute computer readable instructions, that when executed by the processor cause the processor to acquire at least one graphical representation of the RF spectrum data, and extract at least one signal property of the RF signal from the graphical representation.

Further, it is provided: A measurement application device comprising a signal processing device for processing acquired RF spectrum data that represents an RF signal, the signal processing device comprising a processor configured to execute computer readable instructions, that when executed by the processor cause the processor to acquire at least one graphical representation of the RF spectrum data, and extract at least one signal property of the RF signal from the graphical representation.

The present disclosure is based on the finding that the traditional storage of RF signal data that comprises storing RF signal data as IQ data will result in a very high consumption of data memory or storage space.

The present disclosure instead of storing IQ data in a file, relies on storing visual representations of the RF signal, as they may be provided by a measurement application device according to the present disclosure or a respective signal processing device according to the present disclosure. The measurement application device may, for example, be implemented by at least one of a spectrum analyzer, an, especially digital, oscilloscope with FFT & spectrogram capability or a software defined radio receiver/emitter, a vector signal analyzer or a vector signal generator.

The method according to the present disclosure uses a graphical representation of RF spectrum data that represents the respective RF signal as a basis for extracting at least one signal property of the RF signal from the graphical representation.

The graphical representation of the RF spectrum data may, for example, be provided as image data or as image file that may be processed according to the method of the present disclosure. Such an image data or image file may be provided by the measurement application device that acquires the RF signal.

Instead of storing the full IQ data, as in traditional applications, with the method of the present disclosure only the graphical representation of the RF spectrum data needs to be stored and may later be processed to determine specific signal properties of the RF signal, when required. Consequently, there is no need to further store the IQ data. Instead, only the graphical representation is stored that requires an important amount less of the data memory or storage space than the IQ data.

With the present disclosure it is, therefore, possible to efficiently store RF spectrum data for later processing with reduced data memory requirements, therefore, allowing for an increased recording or acquisition time for acquiring the RF signal, while at the same time reducing the storage space that is required in a data storage.

By reducing the required storage space and implementing simple analysis of graphical representations, the method according to the present disclosure may be implemented with reduced hardware resources or a reduced footprint, which may also result in a reduced weight of the application. The method according to the present disclosure may, therefore, be used in mobile and light-weight applications, for example, in satellites and unmanned aerial vehicles (UAVs) or drones.

Further, in the measurement application no IQ recorder and/or IQ streaming hardware is required, which further reduces the complexity of the measurement application.

Further embodiments of the present disclosure are subject of the further dependent claims and of the following description, referring to the drawings.

In the following, the dependent claims referring directly or indirectly to claim 1 are described in more detail. For the avoidance of doubt, the features of the dependent claims relating to the method can be combined in all variations with each other and the disclosure of the description is not limited to the claim dependencies as specified in the claim set. In addition, the signal processing device, the measurement application device may also be combined in all variations with the features of each dependent claim that depends on claim 1.

In an embodiment, which can be combined with all other embodiments of the method, the signal processing device and the measurement application device mentioned above or below, the graphical representation may comprise at least one of: a frequency sweep waveform or a Fourier-transform waveform; a spectrogram; a color-to-power mapping indication; and an alphanumeric representation of at least one of: a sweep time; a total acquisition time; a resolution bandwidth; a video bandwidth; a center frequency; a frequency span; and a number of sweep points.

The graphical representation may comprise a human-readable information. The term human-readable in this context refers to the graphical representation being provided in a fashion that allows a human user to determine specific details, parameters or properties of interest from the graphical representation.

The frequency sweep waveform may, for example, show a power-to-frequency waveform for the RF signal. The spectrogram may show color-coded versions of a frequency sweep waveform in each one of a plurality of lines that may be shown, especially aligned with the frequency sweep waveform. The color-to-power mapping indication may provide a mapping for the colors used in the spectrogram to a respective power level.

Instead of a frequency sweep waveform, a Fourier-transform waveform may also be shown. Such a Fourier-transform waveform may be calculated, for example, based on an acquired time-line of samples of the RF signal.

Of course, some further information may be provided with the graphical representation that allows determining details, like frequencies, bandwidths, and the like for the RF spectrum data.

Such information may be provided—as indicated above—in a human-readable fashion, for example, as alphanumeric characters. The alphanumeric characters may, for example, indicate a sweep time, a total acquisition time, a resolution bandwidth, a video bandwidth, a center frequency, a frequency span, and a number of sweep points used for generating the frequency sweep waveform and the spectrogram.

The sweep time may refer to the time used by the measurement application device that acquired the RF signal to sweep through a specific frequency range.

The total acquisition time may refer to the total amount of time used to acquire all frequency sweep waveforms that are combined in the spectrogram.

The frequency range may be indicated by the center frequency and the frequency span, wherein the center frequency refers—as the name implies—to the frequency in the center of the frequency range, and the span refers to the total span of the frequency range. For example, a center frequency of 650 MHz and a frequency span of 20 MHz will result in a frequency range from 640 MHz to 660 MHz. In embodiments, a start frequency and an end frequency may be indicated for the frequency range in the graphical representation.

The resolution bandwidth may refer to the bandwidth of a filter element, especially a bandpass filter, in the measurement application device that acquires the RF signal. The resolution bandwidth, therefore, influences how the RF signal is acquired.

The video bandwidth in contrast may refer to a filter in the output signal chain that displays the frequency sweep waveform to a user. The video bandwidth determines the capability to discriminate between two different power levels. Since a narrower video bandwidth will remove noise in the detector output, the filter may be used to "smooth" the display by removing noise from the envelope.

The number of sweep points may refer to the number of measurements that are performed during a single sweep of the full frequency range.

In another further embodiment, which can be combined with all other embodiments of the method, the signal processing device and the measurement application device mentioned above or below, the graphical representation may comprise a screenshot of a measurement application device that acquires the RF signal.

Usually, a measurement application device will be used to acquire the RF signal. Such measurement application devices usually comprise some kind of user display, either integrated into the measurement application device or as external display, for example, via an application on a computer. A measurement application device will usually display a plurality of details, parameters, and properties of the RF signal and the performed measurement to the user.

The graphical representation of the RF signal may, therefore, be provided as a screenshot of the user display of such a measurement application device. Examples will be shown below.

Modern measurement application devices may already comprise a function to record screenshots. Therefore, the graphical representation may easily be provided with such measurement application devices.

It is understood, that a plurality of screenshots may be stored for a single RF signal. The graphical representation in such embodiments may comprise a single one of the screenshots, or at least two of the screenshots. Of course, this also applies if the graphical representation is generated differently and not based on screenshots.

The frequency for storing the screenshots may be determined by the sweep time or the total acquisition time. A screenshot may, therefore, be stored after every frequency sweep. Alternatively, a screenshot may be stored after a number of frequency sweeps is performed, the number of frequency sweeps being at the most as high as the number of lines in the spectrogram. In any case, the lower the sweep time, the higher the frequency for storing the screen shots will be. The sweep time in contrast will be defined by the frequency span.

In a further embodiment, which can be combined with all other embodiments of the method, the signal processing device and the measurement application device mentioned above or below, the graphical representation is provided as a vector-based image. The vector-based image comprises single elements, like alphanumeric characters and waveforms a vector-based objects. In addition, specific reference terms or labels may be provided with the objects.

The method may comprise extracting the signal properties by extracting the objects from the vector-based image.

In a further embodiment, which can be combined with all other embodiments of the method, the signal processing device and the measurement application device mentioned above or below, the at least one signal property may comprise at least one of: a power level; a signal bandwidth; a signal power; a center frequency; a channel utilization; a signal on/off time; and a time-domain signal representation.

When determining signal properties, any signal property that may be determined based on the graphical representation may be determined.

Such properties may specifically comprise the power level, which may be determined based on the height of the waveform in the frequency sweep waveform or the colors in the spectrogram.

Another signal property may comprise the bandwidth or signal bandwidth, which may also be determined by identifying a respective section in the waveform of the frequency sweep waveform or based on the colors in the spectrogram that allow separating background noise from the RF signal.

A further signal property may comprise the signal power that may be determined for a single sweep by looking up the colors of the respective line in the spectrogram based on the color-to-power mapping indication provided in the graphical representation.

A further signal property may comprise the center frequency, not of the frequency range of the frequency sweep, but of the RF signal. This center frequency may be determined by identifying the signal bandwidth and determining the center frequency graphically i.e., by searching for the position of the center of the signal in the graphical display of the frequency range and calculating the center frequency based on the identified position.

Another signal property may comprise the channel utilization or on/off time. These signal properties may be determined by analyzing the single lines in the spectrogram for the presence of the RF signal and summing up the number of lines that comprise the RF signal. The channel utilization may then be e.g., the number of lines that comprise the RF signal divided by the total number of lines in the spectrogram.

A further signal property may be the time-domain signal representation of the RF signal. A time-domain signal representation may be determined for example, based on the single rows of the spectrogram that represent the RF signal in the frequency domain during different points in time. For example, an inverse Fourier-transform may be applied to generate the time-domain waveform. The RF signal may also be reproduced by a signal generation-type of measurement application device that may be configured based on the extracted signal properties.

In another embodiment, which can be combined with all other embodiments of the method, the signal processing device and the measurement application device mentioned above or below, the graphical representation may comprise a spectrogram and a color-to-power mapping indication.

The method may further comprise: separating the background and the foreground of the spectrogram; and determining at least one of a signal bandwidth, a signal power, a channel utilization, and a signal on/off time based on the separated background and foreground.

The processor may further execute instructions that cause the processor to perform these steps.

The spectrogram carries information that is especially adequate to determine the signal bandwidth, the signal power, and the channel utilization or signal on/off time.

Separating the background and the foreground may for example be performed by deleting all pixels from the spectrogram that have a color that represents a power level below the power threshold value. The power threshold value may be determined, for example by a user. Alternatively, the power threshold may be determined automatically, for example, by averaging the power of all pixels, or by determining power level bins and deleting all pixels in the bin that represents the lowest power level that comprises signal components. As further alternative, the Otsu method of thresholding images may be applied. The power levels of the background will usually be the lowest, since the background is caused by noise.

After the background is separated from the foreground, all pixels in the foreground will usually represent components of the RF signal and may, therefore, be used to determined signal properties.

In another embodiment, which can be combined with all other embodiments of the method, the signal processing device and the measurement application device mentioned above or below, the method may further comprise determining a signal bandwidth of the RF signal by counting the number of pixels that comprise a color in each of the lines of the foreground of the spectrogram.

The processor may further execute instructions that cause the processor to perform these steps.

After separating the background of the spectrogram from the foreground of the spectrogram, the signal bandwidth may easily be determined by determining the width of the RF signal in the single lines of the spectrogram. Of course, the width may be determined for a single line. Alternatively, the width may be determined for multiple or all lines in the spectrogram, and an average value may be determined as the bandwidth or the bandwidth may be provided line-wise.

In a further embodiment, which can be combined with all other embodiments of the method, the signal processing device and the measurement application device mentioned above or below, the method may further comprise determining a signal power by summing up the power values of pixels that comprise a color in each of the lines of the foreground of the spectrogram. The processor may further execute instructions that cause the processor to perform these steps.

Likewise, after separating the background of the spectrogram from the foreground of the spectrogram, the signal power may easily be determined by summing up the power values represented by the single pixels in the foreground of the spectrogram. Of course, the signal power may be determined for a single line, multiple or all lines in the spectrogram, and an average value may be determined as the signal power or the signal power may be provided line-wise.

In an embodiment, which can be combined with all other embodiments of the method, the signal processing device and the measurement application device mentioned above or below, the method may further comprise determining a channel utilization or a signal on/off time by counting the number of lines of the spectrogram that comprise pixels that comprise a color in the foreground of the spectrogram. The processor may further execute instructions that cause the processor to perform these steps.

Likewise, after separating the background of the spectrogram from the foreground of the spectrogram, the channel utilization or a signal on/off time may easily be determined by comparing the lines in the foreground of the spectrogram that comprise signal components vs. the lines in the foreground of the spectrogram that do not comprise signal components.

If for example, 90% of the lines comprise signal components, the channel utilization may be determined to be 90%.

The signal on/off time may be determined based on the sweep time and the number of lines that comprise signal components.

In another embodiment, which can be combined with all other embodiments of the method, the signal processing device and the measurement application device mentioned above or below, the method may further comprise applying at least one of the following image manipulations: when the graphical representation comprises a colored graphical representation, converting the colored graphical representation into a greyscale or black-and-white graphical representation; resizing the graphical representation; blurring the graphical representation; scaling the graphical representation down; scaling the graphical representation up, especially by pixel splitting; and inverting the graphical representation.

The processor may further execute instructions that cause the processor to perform these steps.

Since the graphical representation may comprise an image or, as explained above, a screenshot, different image manipulations may be applied to simplify the task of extracting the signal properties and/or to reduce the data size required for storing the graphical representation.

A possible image manipulation may comprise converting a colored graphical representation into a greyscale graphical representation, which will reduce the size of the image data.

Of course, depending on the resolution or accuracy that is required for the signal properties, the graphical representation may also be resized, especially down-sized or down-scaled, or blurred for better compression.

On the other hand, the graphical representation may also be up-scaled to increase the resolution or accuracy of the signal properties. While pixel splitting is explicitly named, any adequate up-scaling algorithm may be applied.

Inverting refers to changing or switching colors in an image, as it may also be performed with image manipulation tools. In a black-and-white image, inverting may e.g., be performed by exchanging all white pixels for black pixels and vice versa.

In a further embodiment, which can be combined with all other embodiments of the method, the signal processing device and the measurement application device mentioned above or below, extracting may comprise applying at least one of the following to the graphical representation: image processing algorithms; optical character recognition; and an artificial intelligence-based algorithm trained to extract the respective signal property.

Depending on the type of graphical representation and/or the required signal properties, different methods to extract the required signal properties may be applied.

If for example, pixels are to be identified, counted or the like, as explained above, known image processing may be applied that comprises reading the pixel-wise data of the graphical representation and performing the respective calculations, for example, with a respective computer program or function.

If alphanumeric values are to be extracted, an optical character recognition may be applied to identify the respective alphanumeric characters. The position of the alphanumeric characters may be known in advance, and only the respective sections of the graphical representation may be provided to the optical character recognition.

In other embodiments, the position of the alphanumeric characters may be unknown. In such embodiments, optical character recognition may be performed on the whole of the graphical representation and specific keywords may be searched to identify the respective signal properties.

If, for example, the resolution bandwidth is to be determined, the keyword "RBW" may be searched in the text resulting from the optical character recognition, and an alphanumeric value following the keyword may be used as the signal property. Just as an example, the resolution bandwidth may be shown in the graphical representation as "RBW 1 MHz". After identifying the keyword RBW, the following "1 MHz" may be used as the value of the resolution bandwidth. Other signal properties may be determined analogously.

As further alternative, an artificial intelligence-based algorithm may be used to identify the required signal properties. The artificial intelligence-based algorithm may be trained with training data that may be provided by a measurement application device. Such a measurement application device may provide screenshots together with a data file that comprises all signal properties in a computer-readable format for performing the respective training of the artificial intelligence-based algorithm.

It is understood, that all image manipulation and analysis algorithms mentioned in this disclosure may be applied to the graphical representation directly in the measurement application device that generates the graphical representation. As alternative, the image manipulation and analysis algorithms may be applied after storing the graphical representation, for example by a server, a cloud service, a user's computer or a measurement application playback device.

In addition, it is understood, that all image manipulation and analysis algorithms mentioned in this disclosure may be applied to the graphical representation as a whole or to sections of the graphical representation.

In another embodiment, which can be combined with all other embodiments of the method, the signal processing device and the measurement application device mentioned above or below, the method may further comprise at least one of: storing the extracted at least one signal property in a data file; and displaying the extracted at least one signal property to a user.

The processor may further execute instructions that cause the processor to perform these steps.

It is understood, that the extraction of the signal properties may be performed automatically, especially for reproducing the RF signa, as will be explained in more detail below. If the signal properties are automatically extracted, the signal properties may be stored, especially in a respective file or database, for late use. The data may, for example, be stored locally in the measurement application device that extracts the signal properties, or on a server that provides access for storing the signal properties, for example, via a respective API or a shared folder.

However, the extraction of the signal properties may also be user-guided or user-initiated and the resulting signal properties may be provided to the user in the form of a data file or may be displayed to the user. Of course, the signal properties in such an embodiment may also be stored as explained above.

In an embodiment, which can be combined with all other embodiments of the method, the signal processing device and the measurement application device mentioned above or below, the method may further comprise: acquiring the RF signal; converting the acquired RF signal into the RF spectrum data; generating the at least one graphical representation based on the RF spectrum data; and storing the at least one graphical representation of the RF spectrum data.

The processor may further execute instructions that cause the processor to perform these steps.

The method may not only comprise the analyzing part for determining the required signal properties. Instead, in embodiments, the method may also comprise acquiring the RF signal and converting the acquired RF signal into the graphical representation.

In embodiments, the method according to the present invention may only comprise the steps required for generating the graphical representation. These steps may comprise, but are not limited to, the steps of acquiring, converting, generating, and storing as indicated above.

To this end, a measurement application device may acquire the RF signal, that may then be converted, especially by the same measurement application device, into RF spectrum data if it is not recorded directly as RF spectrum data. This conversion may, for example, comprise applying a Fourier-transform to an acquired RF signal, and generating a spectrogram based on the Fourier-transformed RF signal.

In an embodiment, which can be combined with all other embodiments of the method, the signal processing device and the measurement application device mentioned above or below, the method may further comprise reproducing the RF signal based on the extracted at least one signal property. The processor may further execute instructions that cause the processor to perform these steps.

The extracted signal properties may be provided to a signal generation device, for example, to a signal vector generator. Such a signal generation device may then use the signal properties to re-generated the RF signal and output the RF signal, for example, to a device under test.

In an embodiment, which can be combined with all other embodiments of the signal processing device mentioned above or below, the signal processing device may further comprise a signal acquisition interface, and the processor may further be configured to execute computer-readable instructions that when executed by the processor cause the processor to: acquire the RF signal; convert the acquired RF signal into the RF spectrum data; generate the at least one graphical representation based on the RF-spectrum data; and store the at least one graphical representation of the RF spectrum data.

In an embodiment, which can be combined with all other embodiments of the signal processing device mentioned above or below, the signal processing device may further comprise a signal output interface, and the processor may further be configured to execute computer-readable instructions that when executed by the processor cause the processor to: reproduce a RF signal based on the extracted at least one signal property via the signal output interface.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
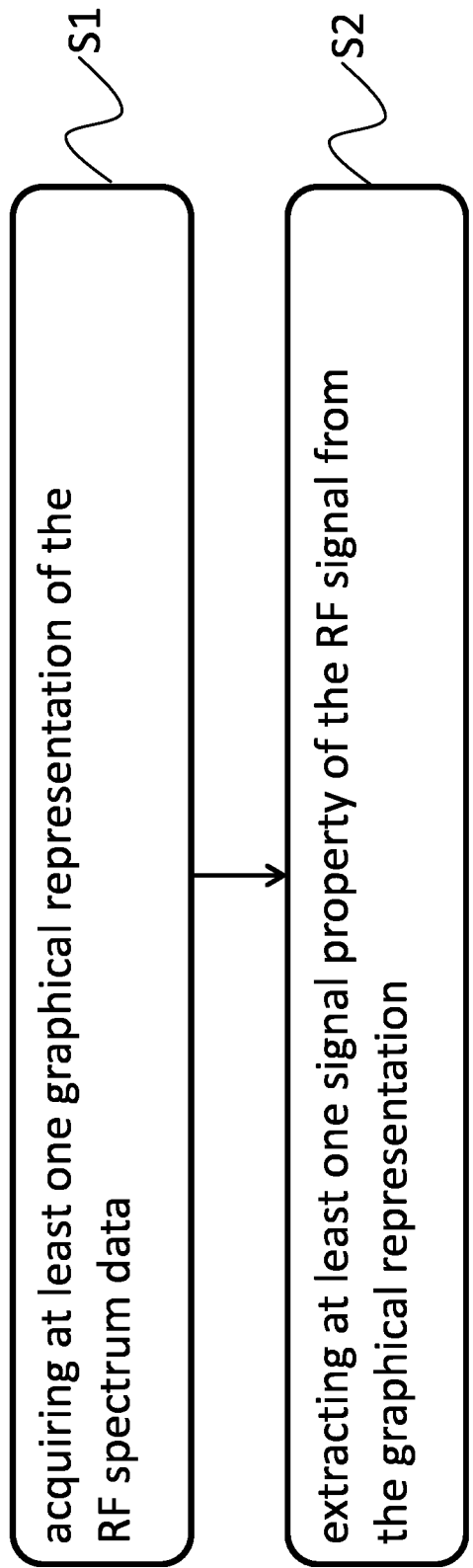
FIG. 1 shows a flow diagram of an embodiment of a method according to the present disclosure.

FIG. 1 shows a flow diagram of a method for processing acquired RF spectrum data that represents an RF signal. The method comprises acquiring S1 at least one graphical representation of the RF spectrum data, and extracting S2 at least one signal property of the RF signal from the graphical representation.

The graphical representation may, for example, be provided as a screenshot of a measurement application device and may comprises at least one of a frequency sweep waveform or a Fourier-transform waveform, a spectrogram, a color-to-power mapping indication. The graphical representation may further comprise an alphanumeric representation of at least one of a sweep time, a total acquisition time, a resolution bandwidth, a video bandwidth, a center frequency, a frequency span, and a number of sweep points.

Such details may, for example, be extracted from the graphical representation via respective image recognition algorithms, image processing algorithms, optical character recognition, and artificial intelligence-based algorithms trained to extract the respective signal properties.

Signal properties that may be extracted in addition to the information indicated above may a power level, a signal bandwidth, a signal power, a center frequency, a channel utilization, a signal on/off time, and a time-domain signal representation.

In a case, where the graphical representation comprises a spectrogram and a color-to-power mapping indication, the method may further comprise separating the background and the foreground of the spectrogram, and determining at least one of a signal bandwidth, a signal power, a channel utilization, and a signal on/off time based on the separated background and foreground.

The foreground will represent or comprise all pixels in the spectrogram that represent the RF signal, while the background will represent or comprise all pixels that represent the background noise that was acquired in addition to the RF signal.

After separating the foreground and the background, the method may comprise at least one of determining a signal bandwidth of the RF signal by counting the number of pixels that comprise a color in each of the lines of the foreground of the spectrogram, determining a signal power by summing up the power values of pixels that comprise a color in each of the lines of the foreground of the spectrogram, and determining a channel utilization or a signal on/off time by counting the number of lines of the spectrogram that comprise pixels that comprise a color in the foreground of the spectrogram.

Prior to extracting the signal properties, different image manipulations may be applied to the graphical representation. Such image manipulations may comprise at least one of resizing the graphical representation, blurring the graphical representation, scaling the graphical representation down, scaling the graphical representation up, especially by pixel splitting, and inverting the graphical representation. When the graphical representation comprises a colored graphical representation, the image manipulations may also comprise converting the colored graphical representation into a grey-scale or black-and-white graphical representation.

For further processing of the extracted signal properties, the extracted signal properties may be stored in a data file. In addition, or as alternative, the extracted signal properties may be displayed to a user.

As already mentioned above, the method may not only comprise determining the signal properties. The method may also comprise acquiring the RF signal, converting the acquired RF signal into the RF spectrum data, generating the at least one graphical representation based on the RF spectrum data, and storing the at least one graphical representation of the RF spectrum data.

It is understood, that the present disclosure also discloses a method that comprises only the above-presented steps required to generate the graphical representation.

Further, the method may not only comprise generating and analyzing the graphical representation. The method may also comprise reproducing the RF signal based on the extracted at least one signal property, for example, with a signal generation device, like a vector signal generator.

It is understood, that the present disclosure also discloses a method that comprises only the above-presented steps required to re-generate the RF signal.

Figure 2:
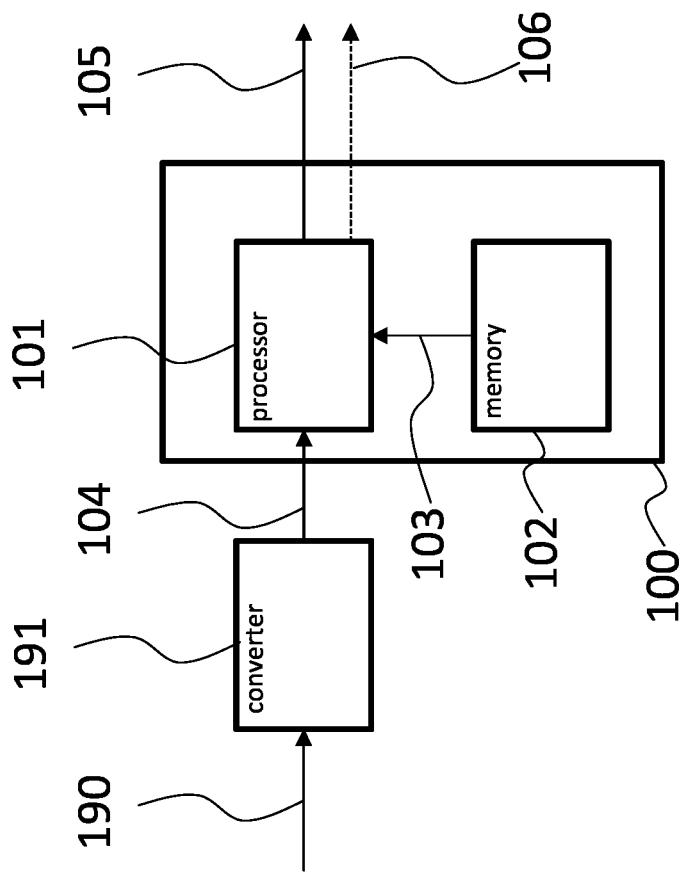
FIG. 2 shows a block diagram of an embodiment of a signal processing device according to the present disclosure.

FIG. 2 shows a signal processing device 100. The signal processing device 100 comprises a processor 101 that is coupled to a memory 102. The processor may read computer readable instructions 103 from the memory 102. These computer readable instructions 103 when executed by the processor 101, cause the processor 101 to perform a method for processing acquired RF spectrum data that represents an RF signal according to any one of the embodiments provided in this disclosure.

The memory 102 may comprise any type of memory unit or memory device, like for example a RAM, ROM, E(E)PROM, a hard disk, an SSD disk or the like. The memory 102 may also be provided as part of a memory that is already present in the respective application i.e., in the signal processing device. The memory 102 may for example be provided as variable or variables or an array of variables or another data structure that is stored in a memory of the signal processing device.

The processor 101 may receive the graphical representation 104 of the RF spectrum. Such a graphical representation 104 may, for example, be provided by an external converter 191 that converts the RF spectrum data 190 into the graphical representation 104. It is understood, that in embodiments, the processor 101 may comprise the function of the converter 191.

The processor 101 analyzes the received graphical representation 104 and extracts the required signal properties 105. As an optional output from the processor 101 a data file 106 is shown. While the signal properties 105 may be provided as digital values to a further device or may be shown to a user, the data file 106 may be stored for later use, for example, on a server or in the device that carries the processor 101.

The processor 101 may be provided as at least one of a dedicated processing element, like e.g., a processing unit, a microcontroller, a field programmable gate array, FPGA, a complex programmable logic device, CPLD, or the like. The processor 101 may at least in part also be provided as a computer program product comprising computer readable instructions that may be executed by a processing element. In a further embodiment, the processor 101 may be provided as addition or additional function or method to the firmware or operating system of a processing element that is already present in the respective application as respective computer readable instructions. Such computer readable instructions may be stored in memory 102 that is coupled to or integrated into the processing element.

In addition, it is understood, that any required supporting or additional hardware may be provided like e.g., a power supply circuitry and clock generation circuitry.

It is further understood, that the signal processing device 100 may comprise respective communication interfaces (not shown) coupled to the processor 101 for receiving the graphical representation 104 and for outputting the signal properties 105 and the data file 106.

It is understood, that the communication interfaces may comprise any kind of wired and wireless communication interfaces, like for example a network communication interface, especially an Ethernet, wireless LAN or WIFI interface, a USB interface, a Bluetooth interface, an NFC interface, a visible or non-visible light based interface, especially an infrared interface.

It is further understood, that the signal processing device 100 and a server for storing the data file 106 may communicate via an intermediary network with each other, and that such a network may comprise any type of network devices, like switches, hubs, routers, firewalls, and different types of network technologies.

Figure 3:
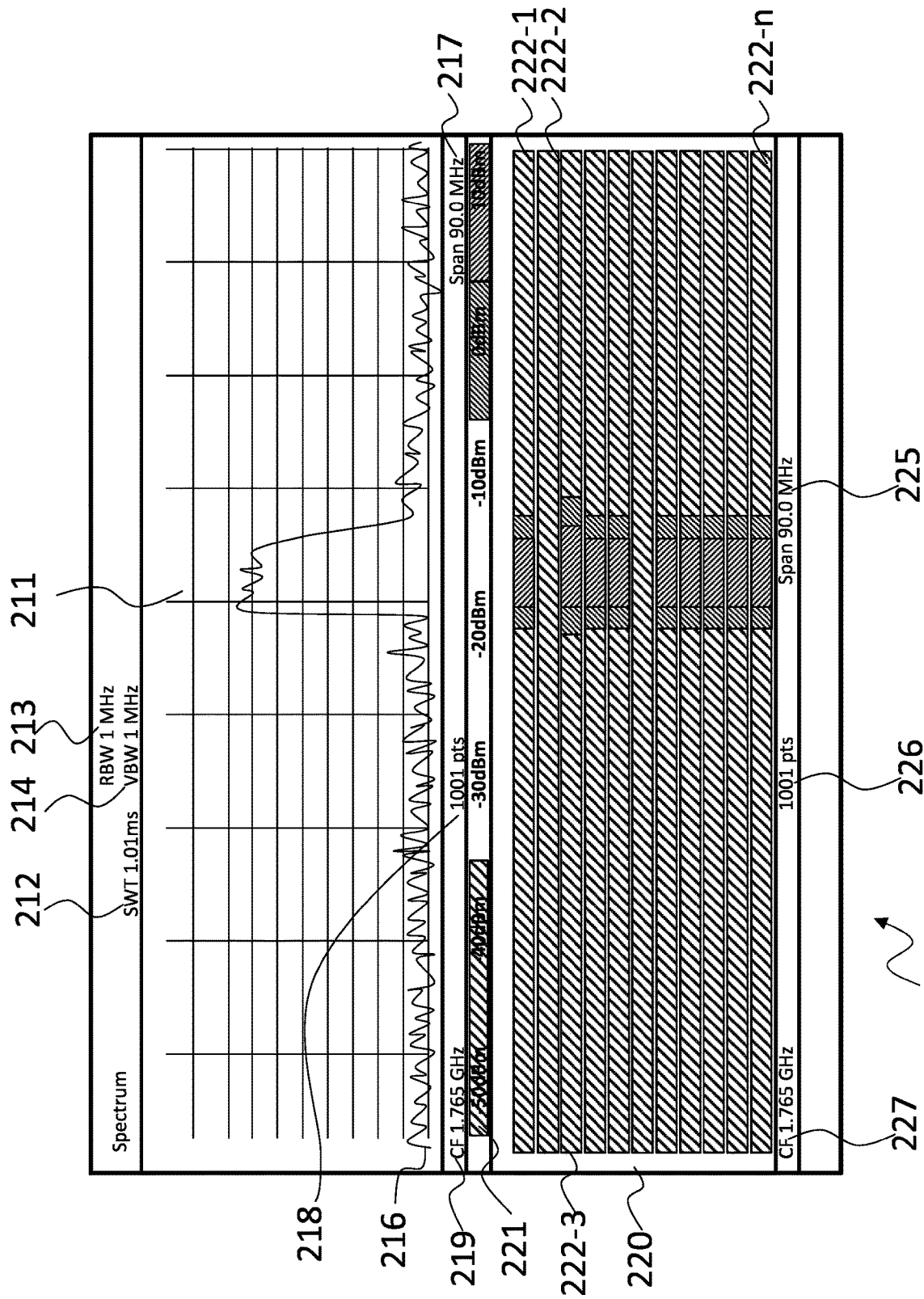
FIG. 3 shows a diagram of an embodiment of a graphical representation according to the present disclosure.

FIG. 3 shows a diagram of a possible graphical representation. The graphical representation of FIG. 3 is a screenshot 210 of a signal processing device or a measurement application device that acquires the RF signal and/or generates the graphical representation.

The screenshot 210 is mainly separated into an upper section and a lower section, wherein the upper section shows a frequency sweep waveform diagram 211, and the lower section shows a spectrogram 220.

The frequency sweep waveform diagram 211 comprises an upper status line and a lower status line. In the upper status line, a sweep time 212 is indicated as the alphanumeric string SWT 1.01 ms. Further, a resolution bandwidth 213 is indicated as the alphanumeric string RBW 1 MHz, and a video bandwidth 214 is indicated as the alphanumeric string VBW 1 MHz. Between the upper status line and the lower status line, a waveform 216 is shown that represents a frequency-power diagram for an acquired RF signal. Below the waveform 216, the lower status line shows a frequency span 217, a number of sweep points 218, and a center frequency 219. It is understood, that the frequency span 217, the number of sweep points 218, and the center frequency 219 refer to the waveform 216.

The spectrogram 220 that is shown below the frequency sweep waveform diagram 211 comprises a color-to-power mapping indication 221 in an upper status line, that is situated below the lower status line of the frequency sweep waveform diagram 211. Below this upper status line, the actual spectrogram comprising spectrogram rows 222-1-222-n is shown. In a lower status line below the spectrogram rows 222-1-222-n, a frequency span 225, a number of sweep points 226, and a center frequency 227 are indicated as alphanumeric strings. Although the frequency span 225, the number of sweep points 226, and the center frequency 227 comprise the same values as in the frequency sweep waveform diagram 211, it is understood, that other values may be used for the spectrogram 220.

The spectrogram rows 222-1-222-n each comprise different shaded sections that reflect the signal power in the respective section, wherein the color-to-power mapping indication 221 indicates the power level for a respective shading. It is understood, that in color images, the power levels may be indicated by a respective color. The shading is meant to replace such colors for the purpose of explanation only.

In the shown example, the first spectrogram row 222-1 comprises on the left a section that represents a low power level i.e., a background noise. More or less in the center a short section that represents a 0 dBm power level, followed by a section that represents a 10 dBm power level, and followed by a section that represents a 0 dBm power level are present. On the right a section that represents the low or background power level is present. The same applies to spectrogram rows 222-4, 222-5, and 222-7-222-11. Spectrogram row 222-3 represents a broader RF signal. Spectrogram rows 222-2 and 222-6 only comprise noise.

It may now be assumed that only the section that represent the 0 dBm power levels and higher are relevant parts of the RF signal representation. By taking the frequency span multiplied by the percentage that these sections cover of the full row, for example, the bandwidth of the RF signal may be determined. As alternative, the width, for example, in pixels, of these sections may be determined and multiplied with a frequency-per-pixel value. The frequency-per-pixel value may be determined as the frequency span divided by the number of pixels in the horizontal axis of the spectrogram rows 222-1-222-n.

The total acquisition time may, for example, be determined by multiplying the sweep time by the number of spectrogram rows 222-1-222-n that are currently analyzed.

It is understood, that although sections with the same shading are shown for sake of simplicity, these shadings refer to a range in the color-to-power mapping indication 221. In actual embodiments, every pixel along the horizontal axis of a spectrogram row 222-1-222-n may comprise a different color referring to a specific power level.

The color-to-power mapping indication 221 comprises shadings for the range of −50 dBm to −40 dBm, for around 0 dBm and around 10 dBm. No shading is provided for the power levels between −40 dBm and 0 dBm, since these do not occur in the spectrogram rows 222-1-222-n.

From the screenshot 210 all of the signal properties mentioned in this disclosure may be determined. For example, the signal properties represented by alphanumeric strings may be extracted via respective optical character recognition (OCR) methods. Other signal properties may be determined by any adequate method, especially as already described above.

As indicated above, different image manipulations may be applied prior to extracting the single signal properties.

Figure 4:
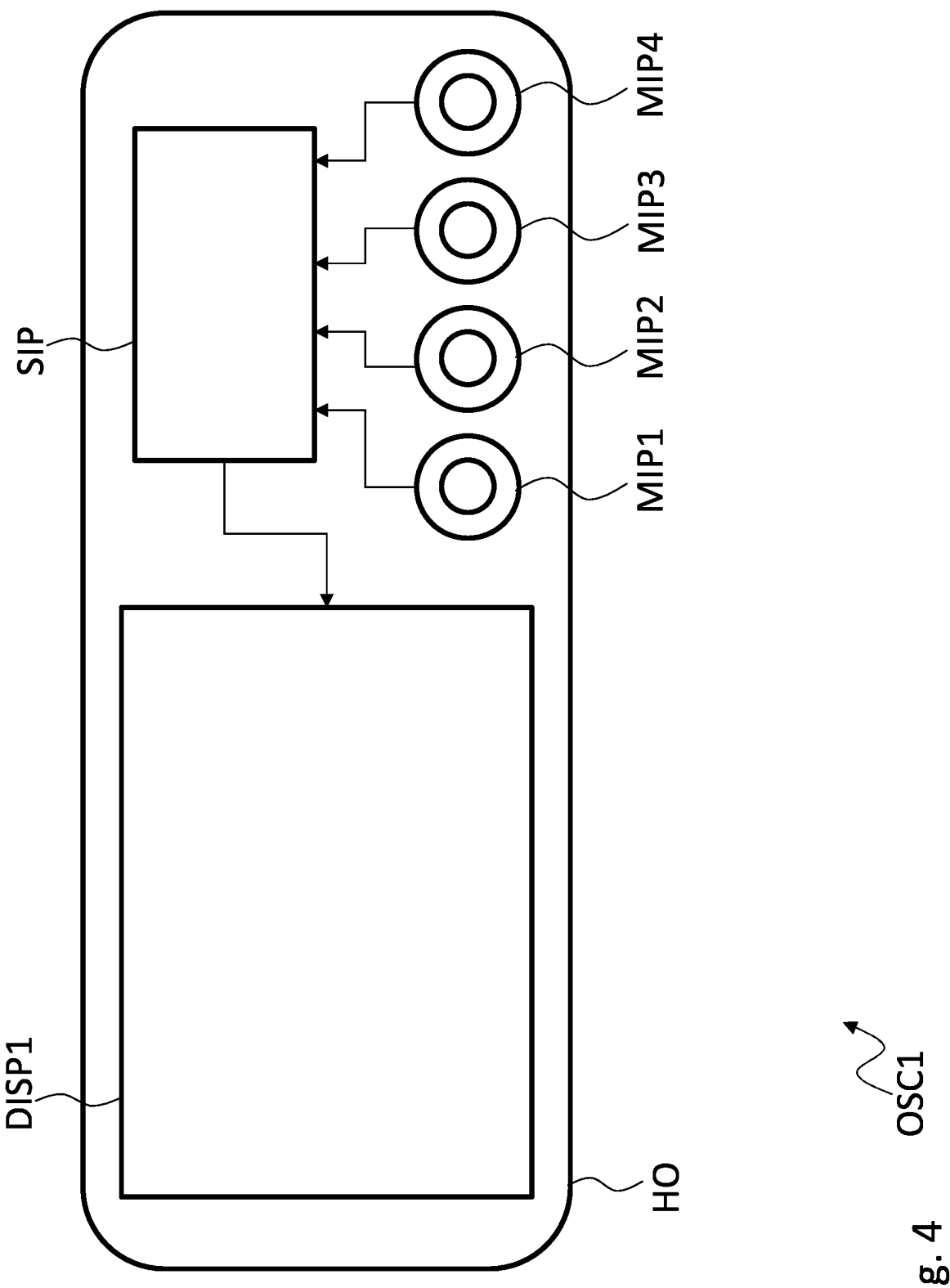
FIG. 4 shows a block diagram of an embodiment of an oscilloscope, which may be used as an embodiment of a measurement application device according to the present disclosure.

FIG. 4 shows a block diagram of an oscilloscope OSC1 that may be used as an embodiment of a measurement application device according to the present disclosure.

The oscilloscope OSC1 comprises a housing HO that accommodates four measurement inputs MIP1, MIP2, MIP3, MIP4 that are coupled to a signal processor SIP for processing any measured signals. The signal processor SIP is coupled to a display DISP1 for displaying the measured signals to a user.

Although not explicitly shown, it is understood, that the oscilloscope OSC1 may also comprise signal outputs that may also be coupled to the differential measurement probe. Such signal outputs may for example serve to output calibration signals. Such calibration signals allow calibrating the measurement setup prior to performing any measurement. The process of calibrating and correcting any measurement signals based on the calibration may also be called de-embedding and may comprise applying respective algorithms on the measured signals.

The signal processor SIP may provide the functionality of the signal processing device, for example the signal processing device 100 shown in FIG. 2, especially the processor of the signal processing device.

In embodiments, the measurement inputs MIP1, MIP2, MIP3, MIP4 may be used to acquire an RF signal, and the signal processor SIP may generate the graphical representation based on the acquired RF signal.

Figure 5:
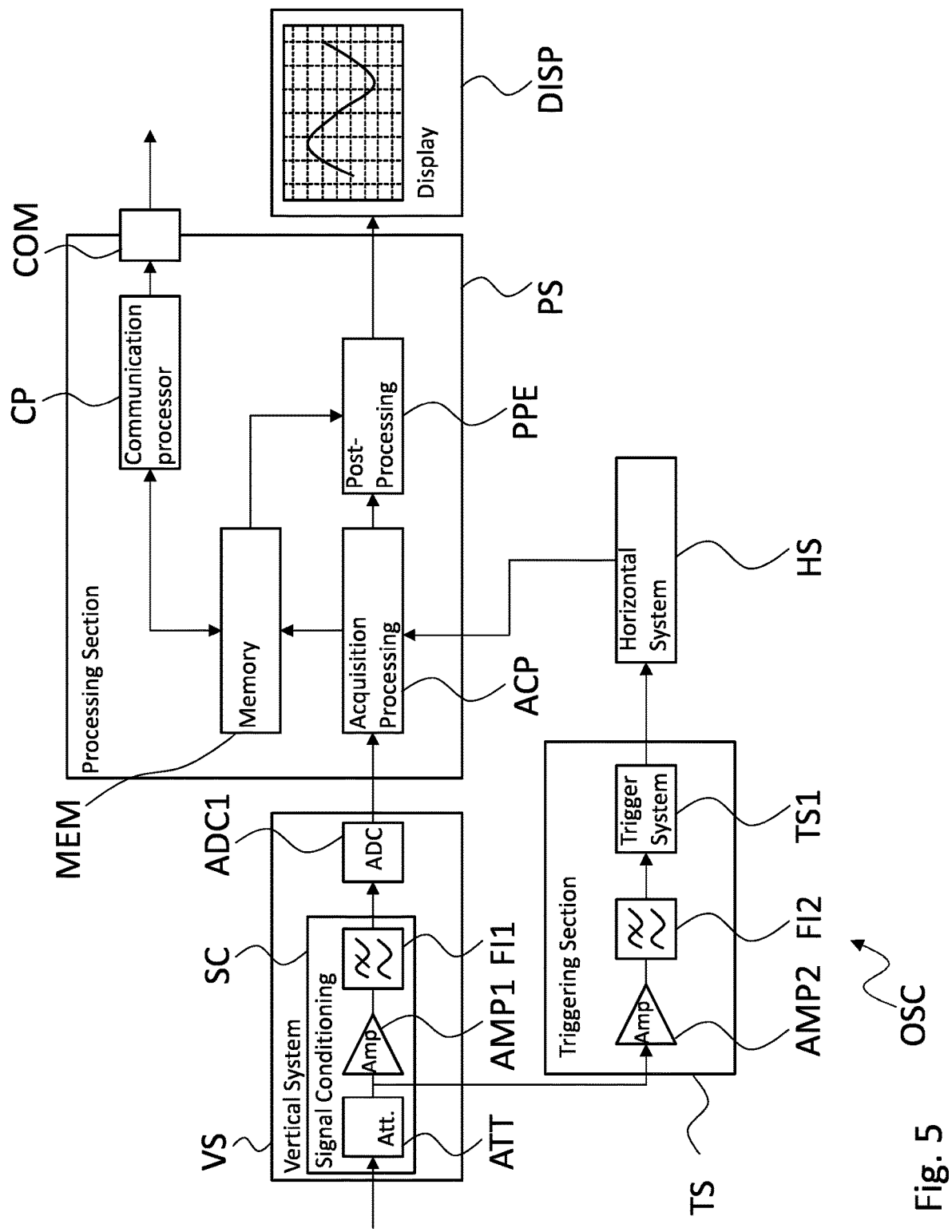
FIG. 5 shows a block diagram of an embodiment of another oscilloscope, which may be used as an embodiment of a measurement application device according to the present disclosure.

FIG. 5 shows a block diagram of an oscilloscope OSC that may be an implementation of a signal processing device or a measurement application device according to the present disclosure. The oscilloscope OSC is implemented as a digital oscilloscope. However, the present disclosure may also be implemented with any other type of oscilloscope.

The oscilloscope OSC exemplarily comprises five general sections, the vertical system VS, the triggering section TS, the horizontal system HS, the processing section PS and the display DISP. It is understood, that the partitioning into five general sections is a logical partitioning and does not limit the placement and implementation of any of the elements of the oscilloscope OSC in any way.

The vertical system VS mainly serves for attenuating or amplifying a signal to be acquired. The vertical system VS may be used to acquire an RF signal. The signal may for example be modified to fit the signal in the available space on the display DISP or to comprise a vertical size as configured by a user.

To this end, the vertical system VS comprises a signal conditioning section SC with an attenuator ATT that is coupled to an amplifier AMP1. The amplifier AMP1 is coupled to a filter FI1, which in the shown example is provided as a low pass filter. The vertical system VS also comprises an analog-to-digital converter ADC1 that receives the output from the filter FI1 and converts the received analog signal into a digital signal.

The attenuator ATT and the amplifier AMP1 serve to scale the waveform of the signal and to condition the amplitude of the signal to be acquired to match the operation range of the analog-to-digital converter ADC1. The filter FI1 serves to filter out unwanted high frequency components of the signal to be acquired.

The triggering section TS comprises an amplifier AMP2 that is coupled to a filter FI2, which in this embodiment is implemented as a low pass filter. The filter FI2 is coupled to a trigger system TS1.

The triggering section TS serves to capture predefined signal events and allows the horizontal system HS to e.g., display a stable view of a repeating waveform, or to simply display waveform sections that comprise the respective signal event. It is understood, that the predefined signal event may be configured by a user via a user input of the oscilloscope OSC.

Possible predefined signal events may for example include, but are not limited to, when the signal crosses a predefined trigger threshold in a predefined direction i.e., with a rising or falling slope. Such a trigger condition is also called an edge trigger. Another trigger condition is called "glitch triggering" and triggers, when a pulse occurs in the signal to be acquired that has a width that is greater than or less than a predefined amount of time.

The triggering section TS operates on the signal as provided by the attenuator ATT, which is fed into the amplifier AMP2. The amplifier AMP2 serves to condition the input signal to the operating range of the trigger system TS1. It is understood, that a common amplifier may also be used instead of the dedicated amplifiers AMP1 and AMP2.

In order to allow an exact matching of the trigger event and the waveform that is shown on the display DISP, a common time base may be provided for the analog-to-digital converter ADC1 and the trigger system TS1.

It is understood, that although not explicitly shown, the trigger system TS1 may comprise at least one of configurable voltage comparators for setting the trigger threshold voltage, fixed voltage sources for setting the required slope, respective logic gates like e.g., a XOR gate, and FlipFlops to generate the triggering signal.

The triggering section TS is exemplarily provided as an analog trigger section. It is understood, that the oscilloscope OSC may also be provided with a digital triggering section. Such a digital triggering section will not operate on the analog signal as provided by the attenuator ATT but will operate on the digital signal as provided by the analog-to-digital converter ADC1.

A digital triggering section may comprise a processing element, like a processor, a DSP, a CPLD or an FPGA to implement digital algorithms that detect a valid trigger event.

The horizontal system HS is coupled to the output of the trigger system TS1 and mainly serves to position and scale the signal to be acquired horizontally on the display DISP.

The oscilloscope OSC further comprises a processing section PS that implements digital signal processing and data storage for the oscilloscope OSC. The processing section PS comprises an acquisition processing element ACP that is couple to the output of the analog-to-digital converter ADC1 and the output of the horizontal system HS as well as to a memory MEM and a post processing element PPE.

The acquisition processing element ACP manages the acquisition of digital data from the analog-to-digital converter ADC1 and the storage of the data in the memory MEM. The acquisition processing element ACP may for example comprise a processing element with a digital interface to the analog-to-digital converter ADC1 and a digital interface to the memory MEM. The processing element may for example comprise a microcontroller, a DSP, a CPLD or an FPGA with respective interfaces. In a microcontroller or DSP, the functionality of the acquisition processing element ACP may be implemented as computer readable instructions that are executed by a CPU. In a CPLD or FPGA the functionality of the acquisition processing element ACP may be configured in to the CPLD or FPGA.

The processing section PS further comprises a communication processor CP and a communication interface COM.

The communication processor CP may be a device that manages data transfer to and from the oscilloscope OSC. The communication interface COM for any adequate communication standard like for example, Ethernet, WIFI, Bluetooth, NFC, an infrared communication standard, and a visible-light communication standard.

The communication processor CP is coupled to the memory MEM and may use the memory MEM to store and retrieve data.

Of course, the communication processor CP may also be coupled to any other element of the oscilloscope OSC to retrieve device data or to provide device data that is received from the management server.

The post processing element PPE may be controlled by the acquisition processing element ACP and may access the memory MEM to retrieve data that is to be displayed on the display DISP. The post processing element PPE may condition the data stored in the memory MEM such that the display DISP may show the data e.g., as waveform to a user.

The display DISP controls all aspects of signal representation to a user, although not explicitly shown, may comprise any component that is required to receive data to be displayed and control a display device to display the data as required.

It is understood, that even if it is not shown, the oscilloscope OSC may also comprise a user interface for a user to interact with the oscilloscope OSC. Such a user interface may comprise dedicated input elements like for example knobs and switches. At least in part the user interface may also be provided as a touch sensitive display device.

The method according to any one of the embodiments shown in the present disclosure may be implemented by the elements of the oscilloscope OSC, especially in the processing section PS of the oscilloscope OSC.

It is understood, that all elements of the oscilloscope OSC that perform digital data processing may be provided as dedicated elements. As alternative, at least some of the above-described functions may be implemented in a single hardware element, like for example a microcontroller, DSP, CPLD or FPGA. Generally, the above-describe logical functions may be implemented in any adequate hardware element of the oscilloscope OSC and not necessarily need to be partitioned into the different sections explained above.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The abstract of the disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

LIST OF REFERENCE SIGNS

S1, S2 method steps
100 signal processing device
101 processor
102 memory
103 computer readable instructions
104 graphical representation
105 signal property
106 data file
210 screenshot
211 frequency sweep waveform diagram
212 sweep time
213 resolution bandwidth
214 video bandwidth
216 waveform
217 frequency span
218 number of sweep points
219 center frequency
220 spectrogram
221 color-to-power mapping indication
222-1-222-n spectrogram row
225 frequency span
226 number of sweep points
227 center frequency
190 RF spectrum data
191 converter
OSC1 oscilloscope
HO housing
MIP1, MIP2, MIP3, MIP4 measurement input
SIP signal processing
DISP1 display
OSC oscilloscope
VS vertical system
SC signal conditioning
ATT attenuator
AMP1 amplifier
FI1 filter
ADC1 analog-to-digital converter
TS triggering section
AMP2 amplifier
FI2 filter
TS1 trigger system
HS horizontal system
PS processing section
ACP acquisition processing element
MEM memory
PPE post processing element
DISP display

What is claimed is:

1. A method for processing acquired RF spectrum data that represents an RF signal, the method comprising:
   by a processor of a signal processing device executing computer readable instructions for processing the acquired RF spectrum data that represents the RF signal:
      acquiring at least one graphical representation of the RF spectrum data; and
      extracting at least one signal property of the RF signal from the graphical representation.

2. The method according to claim 1, wherein the graphical representation comprises at least one of:
   a frequency sweep waveform or a Fourier-transform waveform;
   a spectrogram;
   a color-to-power mapping indication; and
   an alphanumeric representation of at least one of:
      a sweep time;
      a total acquisition time;
      a resolution bandwidth;
      a video bandwidth;
      a center frequency;
      a frequency span; and
      a number of sweep points.

3. The method according to claim 1, wherein the graphical representation comprises a screenshot of a measurement application device that acquires the RF signal.

4. The method according to claim 1, wherein the at least one signal property comprises at least one of:
   a power level;
   a signal bandwidth;
   a signal power;
   a center frequency;
   a channel utilization;
   a signal on/off time; and
   a time-domain signal representation.

5. The method according to claim 1, wherein the graphical representation comprises a spectrogram and a color-to-power mapping indication, the method further comprising:
   separating the background and the foreground of the spectrogram; and
   determining at least one of a signal bandwidth, a signal power, a channel utilization, and a signal on/off time based on the separated background and foreground.

6. The method according to claim 5, the method further comprising determining a signal bandwidth of the RF signal by counting the number of pixels that comprise a color in each of the lines of the foreground of the spectrogram.

7. The method according to claim 5, the method further comprising determining a signal power by summing up the power values of pixels that comprise a color in each of the lines of the foreground of the spectrogram.

8. The method according to claim 5, the method further comprising determining a channel utilization or a signal on/off time by counting the number of lines of the spectrogram that comprise pixels that comprise a color in the foreground of the spectrogram.

9. The method according to claim 1, the method further comprising applying at least one of the following image manipulations:
when the graphical representation comprises a colored graphical representation, converting the colored graphical representation into a greyscale or black-and-white graphical representation;
resizing the graphical representation;
blurring the graphical representation;
scaling the graphical representation down;
scaling the graphical representation up, especially by pixel splitting; and
inverting the graphical representation.

10. The method according to claim 1, wherein extracting comprises applying at least one of the following to the graphical representation:
image processing algorithms;
optical character recognition; and
an artificial intelligence-based algorithm trained to extract the respective signal property.

11. The method according to claim 1, the method further comprising at least one of:
storing the extracted at least one signal property in a data file; and
displaying the extracted at least one signal property to a user.

12. The method according to claim 1, the method further comprising:
acquiring the RF signal;
converting the acquired RF signal into the RF spectrum data;
generating the at least one graphical representation based on the RF spectrum data; and
storing the at least one graphical representation of the RF spectrum data.

13. The method according to claim 1, the method further comprising reproducing the RF signal based on the extracted at least one signal property.

14. A signal processing device for processing acquired RF spectrum data that represents an RF signal, the signal processing device comprising:
a processor configured to execute computer readable instructions, that when executed by the processor cause the processor to:
acquire at least one graphical representation of the RF spectrum data; and
extract at least one signal property of the RF signal from the graphical representation.

15. The signal processing device according to claim 14, wherein the graphical representation comprises at least one of:
a screenshot of a measurement application device that acquires the RF signal;
a frequency sweep waveform or a Fourier-transform waveform;
a spectrogram;
a color-to-power mapping indication; and
an alphanumeric representation of at least one of:
a sweep time;
a total acquisition time;
a resolution bandwidth;
a video bandwidth;
a center frequency;
a frequency span; and
a number of sweep points.

16. The signal processing device according to claim 14, wherein the at least one signal property comprises at least one of:
a power level;
a signal bandwidth;
a signal power;
a center frequency;
a channel utilization;
a signal on/off time; or
a time-domain signal representation.

17. The signal processing device according to claim 14, wherein the graphical representation comprises a spectrogram and a color-to-power mapping indication, the processor being further configured to execute computer-readable instructions that when executed by the processor cause the processor to:
separate the background and the foreground of the spectrogram; and
determine at least one of a signal bandwidth, a signal power, a channel utilization, and a signal on/off time based on the separated background and foreground;
wherein the processor is further configured to execute computer-readable instructions that when executed by the processor cause the processor to at least one of:
determine a signal bandwidth of the RF signal by counting the number of pixels that comprise a color in each of the lines of the foreground of the spectrogram;
determine a signal power by summing up the power values of pixels that comprise a color in each of the lines of the foreground of the spectrogram; and
determine a channel utilization or a signal on/off time by counting the number of lines of the spectrogram that comprise pixels that comprise a color in the foreground of the spectrogram.

18. The signal processing device according to claim 14, the processor being further configured to execute computer-readable instructions that when executed by the processor cause the processor to apply at least one of the following image manipulations:
when the graphical representation comprises a colored graphical representation, converting the colored graphical representation into a greyscale or black-and-white graphical representation;
resizing the graphical representation;
blurring the graphical representation;
scaling the graphical representation down; and
scaling the graphical representation up, especially by pixel splitting.

19. The signal processing device according to claim 14, the processor for extracting the signal properties being further configured to execute computer-readable instructions that when executed by the processor cause the processor to apply at least one of the following to the graphical representation:
image processing algorithms;
optical character recognition; and an artificial intelligence-based algorithm trained to extract the respective signal property.

20. The signal processing device according to claim 14, the processor being further configured to execute computer-readable instructions that when executed by the processor cause the processor to at least one of:
  store the extracted at least one signal property in a data file; and
  display the extracted at least one signal property to a user.

21. The signal processing device according to claim 14, further comprising a signal acquisition interface, the processor being further configured to execute computer-readable instructions that when executed by the processor cause the processor to:
  acquire the RF signal;
  convert the acquired RF signal into the RF spectrum data;
  generate the at least one graphical representation based on the RF spectrum data; and
  store the at least one graphical representation of the RF spectrum data.

22. The signal processing device according to claim 14, further comprising a signal output interface, wherein the processor is further configured to execute computer readable instructions, that when executed by the processor cause the processor to:
  reproduce a RF signal based on the extracted at least one signal property via the signal output interface.

23. A measurement application device comprising:
  a signal processing device for processing acquired RF spectrum data that represents an RF signal, the signal processing device comprising:
    a processor configured to execute computer readable instructions, that when executed by the processor cause the processor to:
      acquire at least one graphical representation of the RF spectrum data; and
      extract at least one signal property of the RF signal from the graphical representation.

* * * * *